United States Patent [19]

Sawase et al.

[11] Patent Number: 5,199,629
[45] Date of Patent: Apr. 6, 1993

[54] WIRE BONDING SYSTEM

[75] Inventors: Kensuke Sawase; Hiromi Ogata, both of Kyoto, Japan

[73] Assignee: Rohm Co., Ltd., Kyoto, Japan

[21] Appl. No.: 810,115

[22] Filed: Dec. 19, 1991

[30] Foreign Application Priority Data

Dec. 21, 1990 [JP] Japan .................................. 2-413173

[51] Int. Cl.⁵ .............................................. H01L 21/60
[52] U.S. Cl. ........................................ 228/4.5; 228/9; 228/102; 228/103
[58] Field of Search ................ 228/4.5, 102, 119, 179, 228/9, 110, 103

[56] References Cited

U.S. PATENT DOCUMENTS

| 4,288,023 | 9/1981 | Larrison | 228/4.5 |
| 4,347,964 | 9/1982 | Takasugi et al. | 228/9 X |
| 5,020,715 | 6/1991 | Kimura et al. | 228/102 |

FOREIGN PATENT DOCUMENTS

| 179123 | 8/1987 | Japan | 228/4.5 |
| 63-96705 | 7/1988 | Japan | . |
| 74723 | 3/1989 | Japan | 228/4.5 |

OTHER PUBLICATIONS

IBM Disclosure Bulletin vol. 29, No. 3, Aug. 1986.

Primary Examiner—Kenneth J. Ramsey
Attorney, Agent, or Firm—Fish & Richardson

[57] ABSTRACT

The spots to be bonded are determined by a light intensity controller as data and bonding is carried out in accordance with the data. The data obtained are stored in a memory or disk memory. In the case of storing the data in the memory, the data is transmitted to a wire bonder as occasion demands, and the wire bonder carries out bonding in accordance with the received data. In the case of storing the data in the disk memory, the disk memory is mounted on the wire bonder. The wire bonder reads out the data from the disk memory as occasion demands and carries out wire bonding.

22 Claims, 4 Drawing Sheets

| ADDRESS | DATA |
|---------|------|
| 0 0 0 0 | 0 1  |
| 0 0 0 1 | 2 F  |
| 0 0 0 2 | 1 4  |
| 0 0 0 3 | 0 2  |
| 0 0 0 4 | 3 F  |
| 0 0 0 5 | 0 4  |

WIRE BONDING SYSTEM

BACKGROUND OF THE INVENTION

1. Field of the Invention

The present invention relates to a wire bonding system for carrying out wire bonding by means of a wire bonder. More particularly, the present invention relates to the improvement in the operability in a system which is capable of automatic bonding at a plurality of spots irregularly arranged on a substrate.

2. Description of the Related Art

A wire bonder is used, for example, in the process of manufacturing an LED head. The LED head is a light-emitting device used for printing in an LED printer. The LED head has an LED array composed of a plurality of aligned LED chips and has a function of printing any given letter or mark by controlling the intensity of light emitted from each of the LED chips.

FIG. 5 shows an example of the structure of an LED head. In FIG. 5, the LED head is viewed from above a substrate 1 and a part of the substrate 1 and a part of the circuit formed on the substrate 1 are enlarged.

In FIG. 5, the reference numeral 2 represents an LED array. The LED array 2 is composed of a plurality of aligned LED chips, but in FIG. 5, the LED chips constituting the LED array 2 are not shown separately from each other. A plurality of drivers 3 are arranged on the substrate 1. Each driver 3 is an integrated driving circuit and has the function of driving the corresponding LED chip. The wiring between the drivers 3 and the LED chips are omitted for the purpose of simplifying the drawing.

The intensity of light emitted from each LED chip must correspond to a predetermined value. It is therefore necessary that the LED head has the function of controlling the intensity of light emitted from each LED chip to be this predetermined value. This task is assigned to a plurality of current controlling resistors provided within the driver 3. These resistors set a current value which is to be supplied to the LED chip which corresponds to the driver 3. The current value is set at any given value by selecting an appropriate resistor or a combination of resistors.

In the structure shown in FIG. 5, a technique of Au wire bonding is adopted for the selection of a resistor. One end of a current controlling resistor provided within the driver 3 constitutes one terminal of the driver 3 and is electrically connected to a bonding pad 4 through an Au wire 5 by Au wire bonding. All terminals of the driver 3 are first connected to the corresponding bonding pads 4. A resistor is then selected by the selective connection between an appropriate bonding pad 4 and a common electrode 6 through an Au wire 7.

In this way, the current controlling resistors provided in the driver 3 are selectively connected to the common electrode 6. Such selective connection enables the intensity of light emitted from each LED chip to be set at any predetermined value.

In this type of LED head, bonding is carried out for the purpose of controlling the intensity of light emitted from each LED chip. Since the resistors selected are different depending upon the drivers, the bonding pads 4 connected to the common electrode 6 by wire bonding are also different depending upon the driver 3.

A conventional wire bonder is capable of simultaneous bonding to a group of bonding pads in accordance with previously input information on the spots to be bonded. For example, if such a wire bonder is used in manufacturing the LED head shown in FIG. 5, the user of the wire bonder previously sets the bonding pads 4 in one driver 3 which are to be connected to the common electrode 6 as the objects of wire bonding. After the preset bonding pads 4 in the driver 3 are automatically connected to the common electrode 6, the user of the wire bonder must select new bonding pads 4 for the next driver 3 as the objects of bonding before the next wire bonding operation.

Because of this, in manufacturing, for example, an LED head which requires bonding having irregular bonding requirements by means of a conventional wire bonder, much labor is required for selecting and setting the spots to be bonded. This is an obstacle to expeditious operation and inconvenient for the user of the wire bonder.

SUMMARY OF THE INVENTION

Accordingly, it is an object of the present invention to eliminate the above-described problems in the related art and to realize a more automated bonding process which dispenses with the step of renewing the setting of the spots to be bonded before each bonding process.

To achieve this aim, the present invention provides a wire bonding system comprising:
- a) a decision means for determining the spots to be wire bonded;
- b) a storage means for storing data on the spots determined to be wire bonded; and
- c) a wire bonder for carrying out wire bonding in accordance with the data.

The present invention also provides a wire bonder comprising:
- a) a means for inputting data on the spots to be wire bonded; and
- b) a means for carrying out wire bonding in accordance with the input data. p According to the present invention, since the spots to be wire bonded are determined prior to the initiation of actual wire bonding using the wire bonder, the complicated operation of renewing the setting of the spots to be bonded before each individual bonding process is dispensed with even when manufacturing an LED head or the like in which the spots to be bonded do not follow a regular pattern because of the necessity of controlling the current value or the like.

In the wire bonding system and the wire bonder of the present invention, data may be input to the wire bonder either through a communication line or by means of an auxiliary storage medium such as a disk memory.

In the case of using a communication line, data is transmitted from a storage means such as a semiconductor memory to the wire bonder. It is preferable that a general-purpose communication system such as RS232C is adopted through an I/O port. The wire bonder preferably has a second storage means for storing the transmitted data. In this case, it is further preferable that the wire bonder is provided with a processor for reading out the data from the second storage means and carrying out wire bonding.

In the case of using a disk memory, a disk drive for writing the data into the disk memory is necessary. The wire bonder is required to have a second disk drive for reading out the data which is written into the disk memory. In this case, it is also preferable that the wire bonder is provided with a processor for reading out the data from the second disk drive and carrying out wire bonding.

The data processed in the present invention preferably has a format including binary data which indicates whether or not actual bonding is necessary with respect to, for example, a plurality of bonding pads which can be the objects of wire bonding. It is further preferable that the format includes data for dividing the plurality of bonding pads which can be the objects of wire bonding into groups and discriminating the groups from each other.

The bonding pads which can be the objects of bonding are generally formed on a substrate. Whether or not bonding is carried out is determined with respect to the plurality of bonding pads which are contained in one group and which can be the objects of bonding, and this step of determination is repeated for every group..

Substrates are preferably accommodated in a magazine so as to facilitate the handling of the substrates. In this case, it is preferable that the decision means takes out the substrates from the magazine which accommodates a plurality of substrates one by one as the objects of determination as to whether or not bonding is carried out. The storage means stores the data in the order in which the substrates are taken out by the decision means, and the wire bonder takes out the substrates from the magazine in the order in which the decision means has taken out the substrates and wire bonding is carried out in that order.

If the present invention is applied to a wire bonding system for LED heads, the wire bonding system comprises:

a) a light intensity controller for determining whether or not bonding is necessary with respect to each of the predetermined bonding pads selected from the plurality of bonding pads formed on the surface of a substrate for an LED head including an LED array by detecting the intensity of light emitted from the LED array;

b) a storage means for storing data on the bonding pads determined to be wire bonded; and c) a wire bonder for carrying out wire bonding in accordance with the data.

The above and other objects, features and advantages of the present invention will become clear from the following description of the preferred embodiments thereof, taken in conjunction with the accompanying drawings.

DESCRIPTION OF THE PREFERRED EMBODIMENTS

Figures 1, 2:
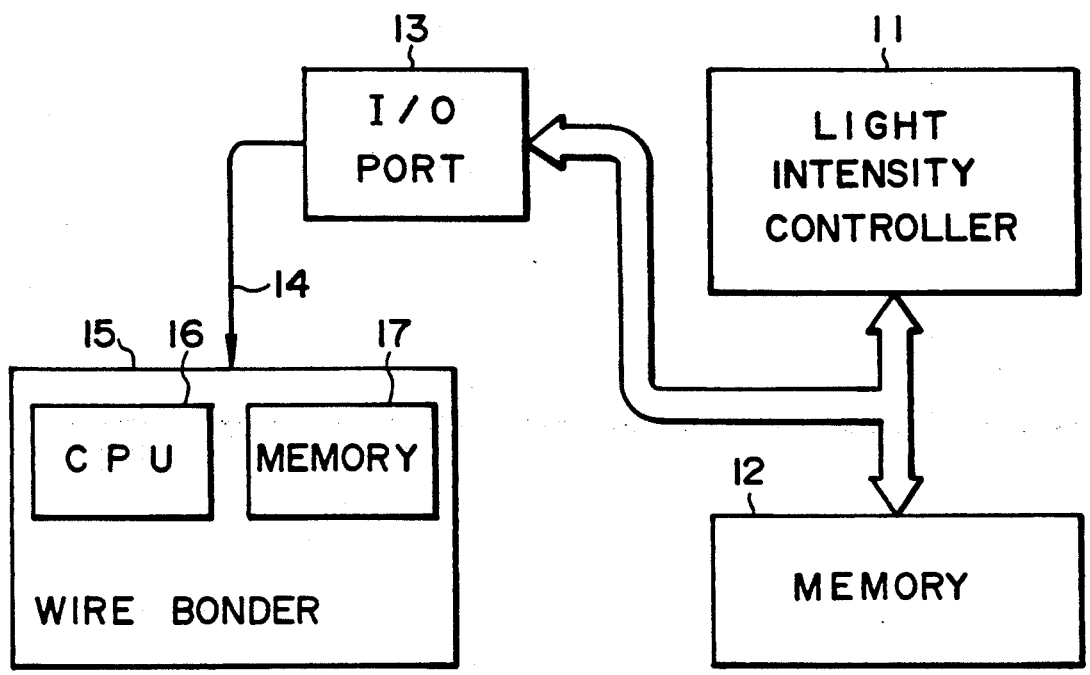
FIG. 1 is a block diagram of the structure of a first embodiment of a wire bonding system according to the present invention.
FIG. 2 shows the contents stored in a memory 12 in FIG. 1.

FIG. 1 shows the structure of a first embodiment of the present invention. The system shown in FIG. 1 has a light intensity controller 11, a semiconductor memory 12, an I/O port 13, a communication line 14 and a wire bonder 15. This system is applicable to the manufacture of an LED head. In this case, connection between bonding pads 4 and a common electrode 6 carried out for the purpose of controlling the intensity of light is realized in a more automated process than in the related art.

Figure 5:
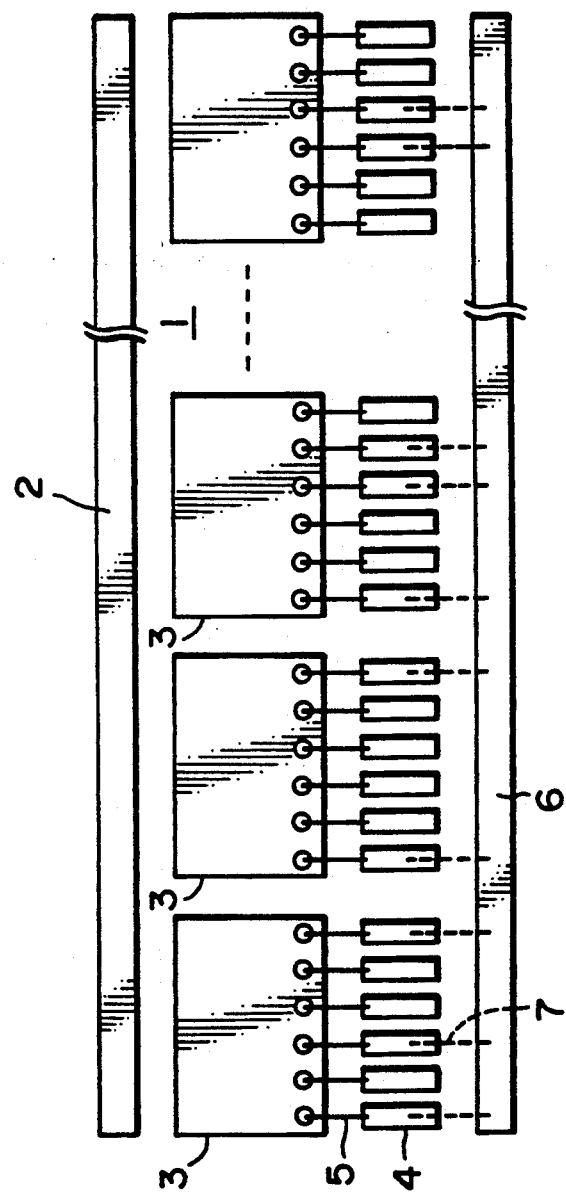
FIG. 5 shows a general structure of an LED head.

When the LED head shown in FIG. 5 is manufactured by means of a conventional wire bonder, it is necessary to renew the setting of the spots to be bonded in the corresponding driver 3 before each wire bonding process. In contrast, in the wire bonding system of this embodiment, such a renewal of the setting of the spots to be bonded is unnecessary. This is because bonding pads 4 are selectively bonded automatically in the bonding process ranging from a certain driver 3 to another driver and from a certain substrate 1 to another substrate 1.

The reason why such automatic selective bonding is enabled by the present invention will be explained with reference to FIGS. 1 and 2.

In this embodiment, the substrates 1 of an LED head are accommodated in a magazine. The magazine (not shown) is provided in the light intensity controller 11. The light intensity controller 11 takes out the plurality of substrates 1 accommodated in the magazine one by one. The necessary intensity of light for each LED chip on the substrate 1 is determined in advance in accordance with the specification of the product. In order to produce the specified intensity of light, the light intensity controller 11 determines which current controlling resistors are connected to the common electrode 6 in each LED chip. The intensity o light obtained in a short-circuit experimentally caused between a terminal of the driver 3 or the bonding pad which has already been connected to the terminal and the common electrode 6 is detected. The objects of the experimental short-circuitting are appropriately varied and a bonding pattern for a plurality of bonding pads 4 with the common electrode 6 is determined for each LED chip.

The memory 12 stores the bonding patterns determined by the light intensity controller 11 in the order in which the substrates 1 are accommodated in the magazine and in the order in which the drivers 3 are arranged on each substrate 1. The data are stored in the memory 12 as shown in FIG. 2. For example, data 01 is stored at an address of 0000, data 2F14 is stored at addresses of 0001 and 0002, data 02 is stored at an address of 0003, and data 3F04 is stored at addresses of 0004 and 0005.

The data of 1 byte stored at the addresses 0000 and 0003 are information for specifying LED chips. For example, a first LED chip on a first substrate is represented by 01, and a second LED chip on the first substrate is represented by 02.

The data of 2 bytes stored at the addresses 0001 and 0002, 0004 and 0005 . . . are information as to which of the plurality of bonding pads 4 corresponding to the LED chip which has been specified by the preceding data of 1 byte (data of 1 byte stored at the addresses 0000, 0003, . . . ) is connected to the common electrode 6. This information is obtained by the light intensity controller 11, as described above. In the example shown in FIG. 2, the data 2F14 on the LED chip represented by 01 and the data 3F04 on the LED chip represented by 02 are stored as the bonding pattern indicating the necessary connection between the plurality of bonding pads 4 and the common electrode 6.

Whether or not an Au wire 7 is bonded to a bonding pad 4 so as to connect the bonding pad to the common electrode 6 is represented by binary data of 1/0.

For example, the data 2F14 stored at the addresses 0001 and 0002 is represented by a binary number 0010111100010100. If "bonding" is represented by "1" and "not bonding" is represented by "0", the data indicates that the third, fifth to eighth, twelfth and fourteenth bonding pads 4 from the left are to be bonded. Although the data length is 2 bytes in this example, the data length may be appropriately set in accordance with the number of bonding pads 4. The example shown in FIG. 2 is applicable to the case in which the number of bonding pads 4 in each LED chip is at most 16.

The I/O port 13 is an interface for transmitting the information stored in the memory 12 to the wire bonder 15 through the communication line 14. As the communication line 14, RS232C or other communication lines having various specifications can be used.

The wire bonder 15 is provided with a CPU 16 and a memory 17. The memory 17 stores the information transmitted through the communication line 14 having the contents such as those shown in FIG. 2. The CPU 16 serially reads out the information from the memory and carries out bonding.

It is possible to mount the magazine (not shown) which accommodates the substrates 1 on the wire bonder 15. This magazine is mounted on the light intensity controller 11 when collecting data. The user of the wire bonding system of this embodiment removes the magazine from the light intensity controller 11 and mounts it on the wire bonder 15 before starting actual bonding. This operation is easy.

The wire bonder 15 takes out the substrates 1 from the magazine one by one and sets them on a bonding bench (not shown). The wire bonder 15 bonds the Au wire 7 to the bonding pad 4 in accordance with the data stored in the memory 17. The wire 7 is simultaneously bonded to the common electrode 6.

In this way, in this embodiment, since the information as to which bonding pads are to be bonded is stored as an item of data and bonding is automatically carried out at one time in accordance with the data, ease of operation is enhanced. The bonding process is speeded up which results in the reduction of manufacturing cost.

Figure 3:
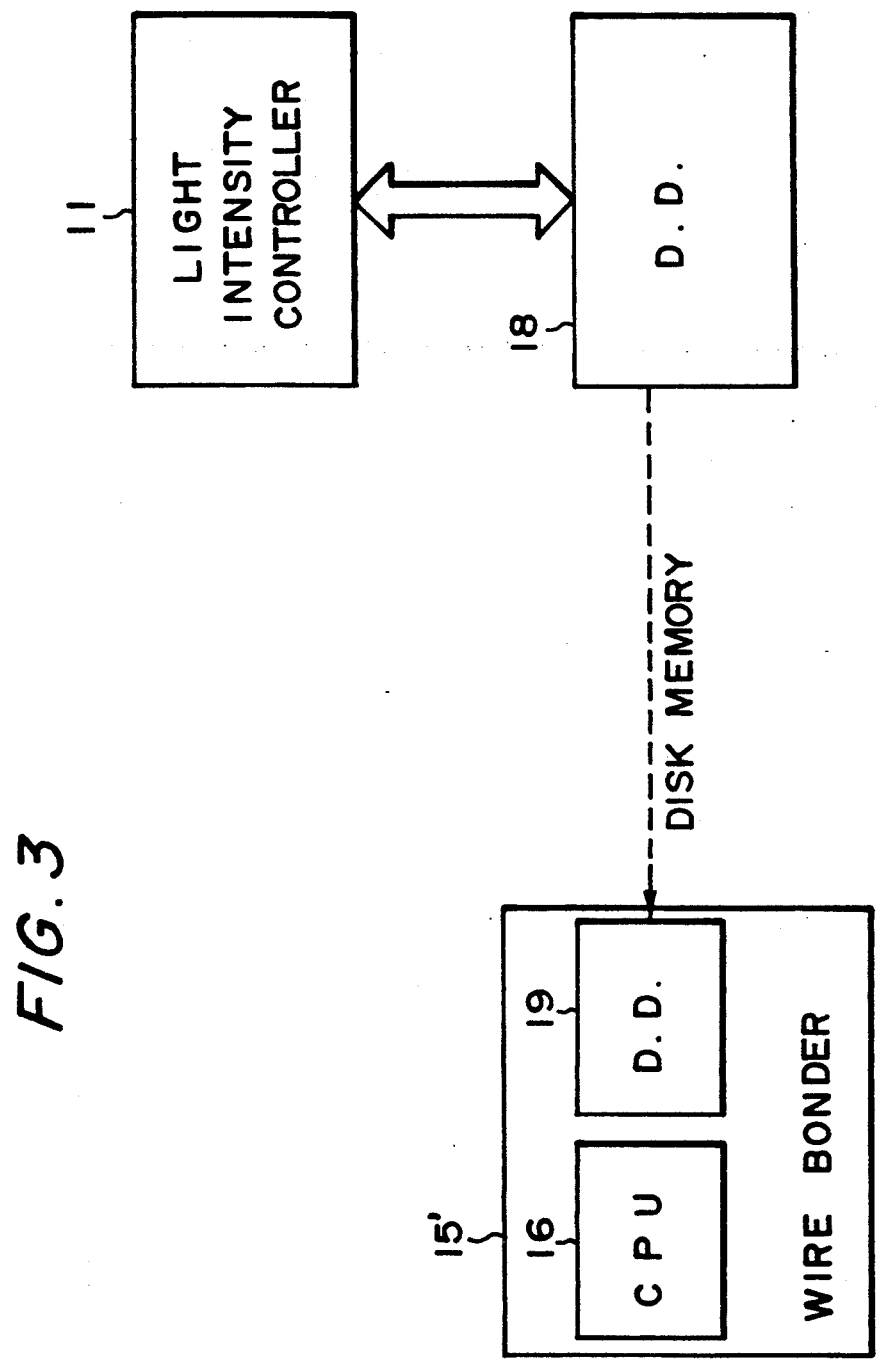
FIG. 3 is a block diagram of the structure of a second embodiment of a wire bonding system according to the present invention.

Although the data obtained from the light intensity controller 11 is temporarily stored in the memory 12 and then transmitted to the wire bonder 15 in this embodiment, it is not always necessary to use the memory 12 and the communication line 14 in order to achieve the object of the present invention. For example, the system may have a structure in which an auxiliary storage medium such as a disk recording medium is mounted on the wire bonder 15 in place of the memory 12 and the necessary data is read out of the auxiliary storage medium by the wire bonder 15. FIG. 3 shows the structure of such a system as a second embodiment of the present invention and FIG. 4 shows the flow of operation of the second embodiment.

This embodiment is provided with the same light intensity controller 11 as that in the first embodiment, a device 18 for storing similar information to that stored in the memory 12 of the first embodiment in the auxiliary storage means (the device 18 is a disk drive—hereinunder referred to as "DD"—when the auxiliary storage medium is a disk memory), and a wire bonder 15' having the CPU 16 and a DD 19.

Figure 4:
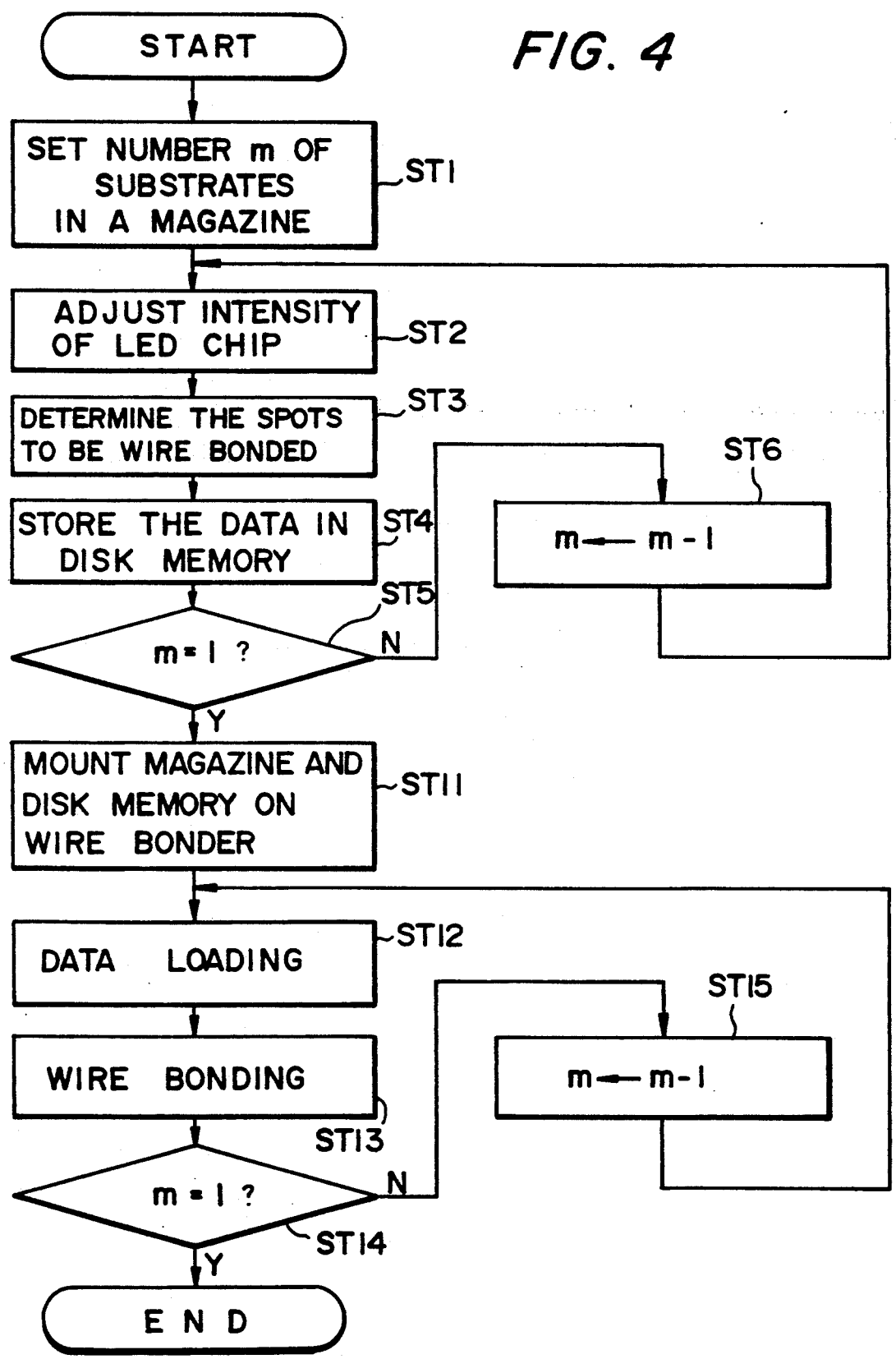
FIG. 4 is a flowchart of the operation of the second embodiment shown in FIG. 3.

The operation of this system is divided into the determination of the bonding pattern by the light intensity controller 11 at steps ST1 to ST6 and the bonding operation of the wire bonder 15' at steps ST11 to ST15 shown in FIG. 4.

The user of this system first sets m, which is the number of substrates 1 accommodated in the magazine, in the light intensity controller 11 at step ST1. The light intensity controller 11 then controls the light intensity for each of the m substrates 1 by the above-described experimental short-circuiting at step ST 2, and determines which pads 4 are to be wire bonded at step ST3. The data obtained is supplied to the DD 18 and stored in the disk memory at the step ST4. This operation is repeated with respect to all of the m substrates 1 at steps ST5 and ST6.

After the data on one magazine is written in the disk memory in this way, the user mounts the disk memory and the corresponding magazine on the DD 19 of the wire bonder 15' at step ST 11. The DD 19 loads the CPU 16 with the data stored in the disk memory at step ST12, and the wire bonder 15' executes bonding under the control of the CPU 16 at step ST13. This operation is repeated with respect to all of the m substrates 1 at steps ST14 and ST15.

This embodiment imparts the same advantages as the first embodiment. A similar advantage is obtained from a system having the functions of both the first and second embodiments.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A wire bonding system comprising:
    a decision means for determining the spots to be wired bonded on a substrate, said decision means determining the spots by performing a short-circuiting operation of the substrate;
    a storage means for storing data on the spots determined to be wire bonded; and
    a wire bonder for carrying out wire bonding in accordance with the data.

2. A wire bonding system according to claim 1, wherein the storage means is a semiconductor memory.

3. A wire bonding system according to claim 2, further comprising a communication line for connecting the semiconductor memory and the wire bonder and transmitting the data stored in the semiconductor memory to the wire bonder.

4. A wire bonding system according to claim 3, further comprising an I/O port, which is an interface for transmitting the data from the semiconductor memory to the wire bonder.

5. A wire bonding system according to claim 1, wherein the wire bonder includes a second storage means for storing the data received from the storage means.

6. A wire bonding system according to claim 5, wherein the wire bonder includes a processor for reading out the data from the second storage means and carrying out wire bonding.

7. A wire bonding system according to claim 1, wherein the storage means is a disk drive for writing the data into a disk memory.

8. A wire bonding system according to claim 7, wherein the wire bonder includes a second disk drive for reading out the data written into the disk memory by the disk drive.

9. A wire bonding system according to claim 8, wherein the wire bonder includes a processor for reading out the data from the second disk drive and carrying out wire bonding.

10. A wire bonding system according to claim 1, wherein the data stored in the storage means includes binary data indicating whether or not actually bonding is necessary with respect to each of the plurality of bonding pads which can be the objects of wire bonding.

11. A wire bonding system according to claim 1, wherein the data stored in the storage means includes data for dividing a plurality of bonding pads which can be the objects of wire bonding into groups and discriminating the groups from each other.

12. A wire bonding system according to claim 11, wherein the decision means includes:
- a means for determining whether or not bonding is necessary with respect to each of the plurality of bonding pads which are contained in one group and which can be the objects of bonding; and
- a means for repeating the determination for every group.

13. A wire bonding system according to claim 11, wherein the decision means determines whether or not bonding is necessary with respect to each of predetermined bonding pads formed on the surface of a substrate.

14. A wire bonding system according to claim 13, wherein the decision means takes out substrates one by one from a magazine which accommodates a plurality of substrates so as to determine whether or not bonding is necessary with respect to each of the predetermined bonding pads on the respective substrates.

15. A wire bonding system according to claim 14, wherein the storage means stores the data in the order in which the decision means takes out the substrates.

16. A wire bonding system according to claim 15, wherein the wire bonder takes out the substrates in the order in which the decision means takes out the substrates and carries out wire bonding in that order.

17. A wire bonding system for LED heads comprising:
- a light intensity controller means for determining which of a plurality of predetermined bonding pads formed on the surface of a substrate for an LED head including an LED array should be bonded by detecting the intensity of light of the LED array;
- a storage means for storing data on the bonding pads determined to be wire bonded; and
- a wire bonder for carrying out wire bonding in accordance with the data.

18. A wire bonding system for bonding a wire on a substrate, comprising:
- means for determining spots to be wire bonded by performing a short-circuiting operation on the substrate; and
- a wire bonder having:
  - an input means for inputting data on the spots to be wire bonded; and
  - a means for carrying out wire bonding in accordance with the input data.

19. A wire bonding system according to claim 18, wherein
the input means is a memory for storing the data supplied from a communication line; and
the wire bonder includes a processor for reading out the data from the memory and carrying out wire bonding.

20. A wire bonding system according to claim 18, wherein
the input means is a disk drive for reading out the data from a disk memory; and
the wire bonder includes a processor for reading out the data from the disk drive and carrying out wire bonding.

21. A wire bonding system for LED heads according to claim 17, wherein said light intensity controller means determines which of said bonding pads should be bonded by performing a short-circuiting operation.

22. A wire bonding system according to claim 1, wherein said decision means includes a light intensity controller means for detecting the intensity of light of an LED array.

* * * * *